United States Patent
Smith (10) Patent No.: US 10,903,811 B2
(45) Date of Patent: Jan. 26, 2021

(54) COAXIAL RF FILTER WITH DISCOIDAL CAPACITOR

(71) Applicant: AVX Corporation, Fountain Inn, SC (US)

(72) Inventor: David M. Smith, Fountain Inn, SC (US)

(73) Assignee: AVX Corporation, Fountain Inn, SC (US)

( * ) Notice: Subject to any disclaimer, the term of this patent is extended or adjusted under 35 U.S.C. 154(b) by 54 days.

(21) Appl. No.: 16/102,114

(22) Filed: Aug. 13, 2018

(65) Prior Publication Data

US 2019/0058449 A1    Feb. 21, 2019

Related U.S. Application Data

(60) Provisional application No. 62/547,533, filed on Aug. 18, 2017.

(51) Int. Cl.
| | |
|---|---|
| *H03H 1/00* | (2006.01) |
| *H03H 7/01* | (2006.01) |
| *H01P 1/202* | (2006.01) |
| *H01R 12/71* | (2011.01) |
| *H01R 13/719* | (2011.01) |

(52) U.S. Cl.
CPC .......... *H03H 1/0007* (2013.01); *H01P 1/202* (2013.01); *H01R 12/71* (2013.01); *H01R 13/719* (2013.01); *H03H 7/0115* (2013.01); *H03H 2001/0042* (2013.01)

(58) Field of Classification Search
CPC ...... H03H 7/0115; H03H 1/0007; H01P 1/202
USPC ................................................ 333/175, 185
See application file for complete search history.

(56) References Cited

U.S. PATENT DOCUMENTS

| | | | | |
|---|---|---|---|---|
| 2,708,219 | A | * | 5/1955 | Carver .................... H04L 27/04 178/23 R |
| 3,267,396 | A | * | 8/1966 | Scott ....................... H01P 1/202 333/167 |
| 3,541,478 | A | * | 11/1970 | Peterson .............. H03H 1/0007 333/182 |
| 3,579,156 | A | * | 5/1971 | Parfitt .................. H03H 1/0007 333/181 |
| 3,879,691 | A | * | 4/1975 | Fritz .................... H01R 13/719 333/182 |
| 4,424,551 | A | | 1/1984 | Stevenson et al. |
| 5,999,398 | A | | 12/1999 | Makl et al. |

(Continued)

OTHER PUBLICATIONS

International Search Report and Written Opinion for PCT/IB2018/056112 dated Nov. 28, 2018, 10 pages.

*Primary Examiner* — Rakesh B Patel
(74) *Attorney, Agent, or Firm* — Dority & Manning, P.A.

(57) ABSTRACT

Disclosed is a filter device comprising at least a shell, a first discoidal capacitor, a second discoidal capacitor, and an inductor. The shell is elongated in a stack direction. The first discoidal capacitor and the second discoidal capacitor are disposed within the shell, where the first discoidal capacitor is stacked above the second discoidal capacitor along the stack direction. The inductor comprises a first patterned conductive line disposed within the shell. The first patterned conductive line is coupled between the first discoidal capacitor and the second discoidal capacitor. The first patterned conductive line is wound in a winding direction traversing the stack direction.

18 Claims, 8 Drawing Sheets

(56) References Cited

U.S. PATENT DOCUMENTS

| | | |
|---|---|---|
| 6,477,032 B2 | 11/2002 | Makl, Jr. |
| 6,781,476 B2 | 8/2004 | Tsunoda et al. |
| 7,853,324 B2 | 12/2010 | Stevenson et al. |
| 7,889,020 B2 | 2/2011 | Hock et al. |
| 7,889,026 B2 | 2/2011 | Parsche et al. |
| 9,061,139 B2 | 6/2015 | Stevenson et al. |
| 9,287,844 B2 | 3/2016 | Bultitude et al. |
| 2003/0184407 A1 | 10/2003 | Tsunoda et al. |
| 2008/0297327 A1* | 12/2008 | Zitting .................. H04B 3/542 375/258 |
| 2009/0179716 A1 | 7/2009 | Gay |
| 2011/0230943 A1* | 9/2011 | Johnson .................. A61N 1/05 607/116 |

* cited by examiner

COAXIAL RF FILTER WITH DISCOIDAL CAPACITOR

CROSS-REFERENCE TO RELATED APPLICATIONS

This application is claims priority to U.S. Provisional Patent Application No. 62/547,533, filed Aug. 18, 2017, the entire disclosure of which is incorporated herein by reference in its entirety, for any and all purposes.

BACKGROUND

The following description is provided to assist the understanding of the reader. None of the information provided or references cited is admitted to be prior art.

A radio frequency (RF) filter device is a component that suppresses an out-of-band portion of an input signal and passes through or amplifies an in-band portion of the input signal. The in-band portion corresponds to an in-band frequency of the RF filter device, and the out-of-band portion corresponds to an out-of-band frequency. By suppressing the out-of-band portion, the in-band portion can be better analyzed for further signal processing or testing. For example, an RF filter device may be connected between two devices (e.g., antenna, low-noise amplifier, mixer, power amplifier, baseband circuit, etc.) of a communication system to suppress unwanted harmonics or noise. For another example, an RF filter device may be connected between testing equipment (e.g., spectrum analyzer, network analyzer, etc.) and a communication system to test an output of the communication system at a certain frequency band.

Some RF filter devices include circuit components such as inductors and capacitors. Inductors and capacitors may have parasitic elements such as parasitic inductance, parasitic capacitance, and parasitic resistance. Parasitic elements may reduce or increase inductances of inductors or capacitances of capacitors. Due to altered inductances or capacitances, an in-band frequency of the RF filter device may deviate from a target frequency band. Adjusting the in-band frequency of the RF filter device to the target frequency band includes tuning some of the circuit components, adding additional circuit components, or both. In addition, parasitic elements may reduce quality factors of circuit components. To compensate for loss in quality factors due to parasitic elements, physical dimensions of circuit components may be increased.

Consequently, a physical dimension of some RF filter device is increased due to additional components added for adjusting the in-band frequency, or increased physical dimensions of circuit components to compensate for loss in quality factors.

SUMMARY

Disclosed is a filter device comprising at least a shell, a first discoidal capacitor, a second discoidal capacitor, and an inductor. The shell is elongated in a stack direction. The first discoidal capacitor and the second discoidal capacitor are disposed within the shell, where the first discoidal capacitor is stacked above the second discoidal capacitor along the stack direction. The inductor comprises a first patterned conductive line disposed within the shell. The first patterned conductive line is coupled between the first discoidal capacitor and the second discoidal capacitor. The first patterned conductive line is wound in a winding direction traversing the stack direction.

In one or more embodiments, the first discoidal capacitor comprises a first electrode having a first tubular shape along the stack direction and a second electrode having a second tubular shape along the stack direction. A cross-section of the second electrode may surround a cross-section of the first electrode.

In one or more embodiments, the first discoidal capacitor and the second discoidal capacitor are multilayer ceramic capacitors.

In one or more embodiments, the first patterned conductive line is formed on a body comprising at least one of a liquid crystal polymer, Aluminum Nitride, and ceramic.

In one or more embodiments, the first patterned conductive line is formed on a body having a tubular shape along the stack direction.

In one or more embodiments, the first patterned conductive line is formed on a body having an increasing height along the stack direction, the height being measured in a perpendicular direction to the stack direction.

In one or more embodiments, the first patterned conductive line is formed on a body having a decreasing height along the stack direction, the height being measured in a perpendicular direction to the stack direction.

In one or more embodiments, the first patterned conductive line is formed on a body. The body may have a first cross-section perpendicular to the stack direction, a second cross-section perpendicular to the stack direction, and a third cross-section perpendicular to the stack direction. The first cross-section may be closer to the first discoidal capacitor than the second cross-section, and the third cross-section may be closer to the second discoidal capacitor than the second cross-section.

In one or more embodiments, a first height of the first cross-section perpendicular to the stack direction may be larger than a second height of the second cross-section perpendicular to the stack direction, and a third height of the third cross-section perpendicular to the stack direction may be larger than the second height.

In one or more embodiments, a first height of the first cross-section perpendicular to the stack direction may be less than a second height of the second cross-section perpendicular to the stack direction, and a third height of the third cross-section perpendicular to the stack direction may be less than the second height.

The foregoing summary is illustrative and is not intended to be in any way limiting. In addition to the illustrative aspects, embodiments, and features described above, further aspects, embodiments, and features will become apparent by reference to the following drawings and the detailed description.

The foregoing and other features of the present disclosure will become apparent from the following description and appended claims, taken in conjunction with the accompanying drawings. Understanding that these drawings depict several embodiments in accordance with the disclosure and are, therefore, not to be considered limiting of its scope, the disclosure will be described with additional specificity and detail through use of the accompanying drawings.

DETAILED DESCRIPTION

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and make part of this disclosure.

Disclosed is a filter device implementing an inductor with a patterned conductive line and a discoidal capacitor. In one or more embodiments, the filter device includes at least a shell, a first discoidal capacitor, a second discoidal capacitor, and an inductor. The shell is elongated in a stack direction. The first discoidal capacitor and the second discoidal capacitor are disposed within the shell, where the first discoidal capacitor is stacked above the second discoidal capacitor in the stack direction. The inductor comprises a first patterned conductive line disposed within the shell. The first patterned conductive line is coupled between the first discoidal capacitor and the second discoidal capacitor. The first patterned conductive line is wound in a winding direction traversing the stack direction.

A patterned conductive line herein refers to a conductive line including a rigid conductive material such as metal (e.g., copper, gold, silver, etc.).

Advantageously, the disclosed filter device can be implemented in a smaller form factor than other filter devices. In particular, implementing an inductor with a patterned conductive line allows a higher inductance to be achieved per unit length. Moreover, implementing discoidal capacitors allows higher capacitance to be achieved per unit length. Furthermore, the disclosed inductor and the discoidal capacitor may have improved quality factors and reduced parasitic elements. Hence, physical dimensions of an inductor and a capacitor may be reduced to achieve target inductance, capacitance, quality factor, or any combination of them, thereby enabling the overall physical dimension of the filter device to be reduced.

Example Coaxial RF Filter Device

Figure 1:
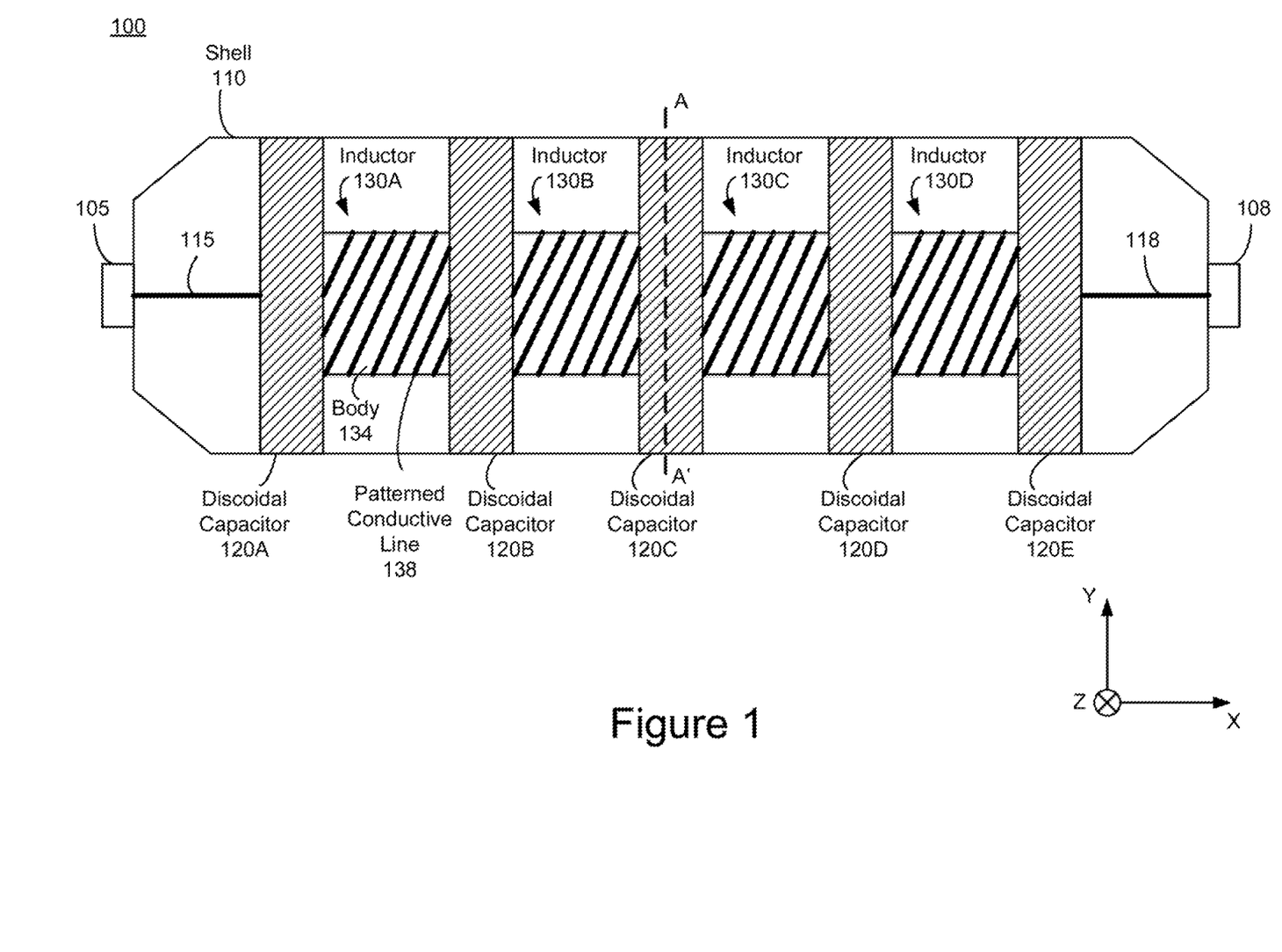
FIG. 1 is a plan view of a coaxial RF filter device with discoidal capacitors and patterned conductive lines, in accordance with an illustrative embodiment.

Referring to FIG. 1, illustrated is a plan view of a coaxial RF filter device 100 (also referred to as "filter device 100" herein) with discoidal capacitors and patterned conductive lines, in accordance with an illustrative embodiment. The filter device 100 includes a shell 110, ports 105, 108, connectors 115, 118, discoidal capacitors 120A, 120B . . . 120E, and inductors 130A, 130B . . . 130D. These components operate together to receive an input signal at the port 105, and suppress out-of-band portion of the input signal to generate an output signal at the port 108. In other embodiments, the filter device 100 includes more, fewer, or different components than shown in FIG. 1.

The ports 105, 108 are interfaces among the circuit components (e.g., discoidal capacitors 120 and inductors 130) of the filter device 100 and external devices. The port 105 may be an electrical signal input port and the port 108 may be an electrical signal output port. Alternatively, the port 105 may be the electrical signal output port and the port 108 may be the electrical signal output port. Examples of external devices include testing equipment (e.g., spectrum analyzer, network analyzer, etc.), a communication system, any devices (e.g., antenna, low-noise amplifier, mixer, power amplifier, baseband circuit, etc.) of a communication system, and any combination of them. In one implementation, the port 105 is coupled to one end of the shell 110 and the port 108 is coupled to another end of the shell 110 in an x-direction (also referred to as "a stack direction" herein). The ports 105, 108 may include conductive materials, and may be implemented as SMA ports, SMP ports, U.FL ports, IPEX ports, IPAX ports, IPX ports, AMC ports, MHF ports, UMCC ports, TNC ports, MMCX ports, or any RF ports.

The shell 110 covers circuit components such as the discoidal capacitors 120 and the inductors 130. In one implementation, the shell 110 has a tubular shape elongated in the x-direction. The shell 110 may be implemented as conductive materials such as micropolished copper. Micropolished copper may be obtained by micropolishing or electropolishing copper. Micropolishing copper allows reduction of skin-depth effects, thereby enhancing electrical characteristics of the filter device 100. The micropolished copper shell 110 helps preventing outside moisture from damaging circuit components within the shell 110. Within the shell 110, the discoidal capacitors 120 may be stacked along the x-direction, where the inductors 130 are interposed between two corresponding discoidal capacitors 120 as shown in FIG. 1. Specifically, the inductor 130A is coupled between the discoidal capacitors 120A, 120B; the inductor 130B is coupled between the discoidal capacitors 120B, 120C; the inductor 130C is coupled between the discoidal capacitors 120C, 120D; and the inductor 130D is coupled between the discoidal capacitors 120D, 120E within the shell 110.

The connectors 115, 118 are hardware components that electrically couple the ports 105, 108 to the discoidal capacitors 120A, 120E, respectively. The connectors 115, 118 may be implemented as conductive wires or traces. In one aspect, the connectors 115, 118 may be inductors that in conjunction with the circuit components (e.g., discoidal capacitors and inductors 130) operate to suppress out-of-band portion of an input signal received at the port 105. The length of the connectors 115, 118 and materials of the connectors 115, 118 may be determined to provide a proper termination (e.g., 50Ω or 75Ω termination).

Each inductor 130 is interposed between two corresponding discoidal capacitors 120. Each inductor 130 includes a body 134 and a patterned conductive line 138 wound on the body 134. The patterned conductive line 138 may be formed by a deposition process or an etching process. The body 134 may have a tubular shape extending along the x-direction, and may include LCP, Aluminum Nitride, ceramic, or any material with a low permittivity and low loss tangent. In some embodiments, the body 134 may have varying heights along the y-direction. Implementing the body 134 with the LCB, Aluminum Nitride, or ceramic allows the patterned conductive line 138 to be formed on a rigid surface of the body 134 with low permittivity. The patterned conductive line 138 is coupled between two corresponding discoidal capacitors 120, and is wound on the body 134 in a winding direction traversing the x-direction. In some embodiments, the patterned conductive line 138 includes rigid materials such as metal (e.g., copper, gold, silver, etc.). The patterned conductive line 138 may be patterned on the body 134 through a deposition or etching process. Beneficially, the disclosed inductor can achieve (i) a higher inductance per unit length along the x-direction, (ii) reduced parasitic elements, and (iii) a higher quality factor than other inductors by implementing the body 134 and the patterned conductive line 138 as disclosed herein. Moreover, the disclosed inductor is less susceptible to change in its characteristics due to a higher rigidity of the patterned conductive line 138 than, for example, a flexible wire wound on a Teflon rod of other inductors. Therefore, adjusting an in-band frequency of the RF filter 100 by tuning the flexible wire or adding additional circuit components during a packing process may be omitted.

In some embodiments, different inductors 130 are implemented in different configurations. In particular, the inductors 130A, 130B, 130C, 130D may have different dimensions of bodies 134 (e.g., lengths along the x-direction, radiuses of bodies 134 in cross-sections orthogonal to the x-direction, or a combination of them), different geometries of the bodies 134, different number of windings of patterned conductive lines 138, windings in different angles with respect to the x-direction, different materials implemented for the bodies 134 or the patterned conductive lines 138, or any combination of them to achieve different inductances with different quality factors.

Each discoidal capacitor 120 is coupled to its adjacent discoidal capacitor 120 through a corresponding inductor 130. In one aspect, each discoidal capacitor 120 includes two tubular shape electrodes facing each other and extending along the x-direction. The electrodes may include conductive materials with dielectric materials in between the electrodes. In some embodiments, the discoidal capacitor 120 is a multilayer ceramic discoidal capacitor. Detailed description of a structure of a discoidal capacitor 120 is provided below with respect to FIG. 2. Beneficially, the discoidal capacitor 120 can achieve (i) a higher capacitance per unit length along the x-direction, (ii) reduced parasitic elements, and (iii) a higher quality factor than other capacitors by implementing two electrodes with tubular shapes facing each other.

In some embodiments, different discoidal capacitors 120 are implemented in different configurations. In particular, the discoidal capacitors 120A, 120B, 120C, 120D, 120E may have different lengths along the x-direction, different radiuses of electrodes in cross-sections orthogonal to the x-direction, different thicknesses of electrodes along a y-direction, different geometries of the electrodes, different materials implemented for the electrodes or dielectric materials, or any combination of them to achieve different capacitances with different quality factors.

Figure 2:
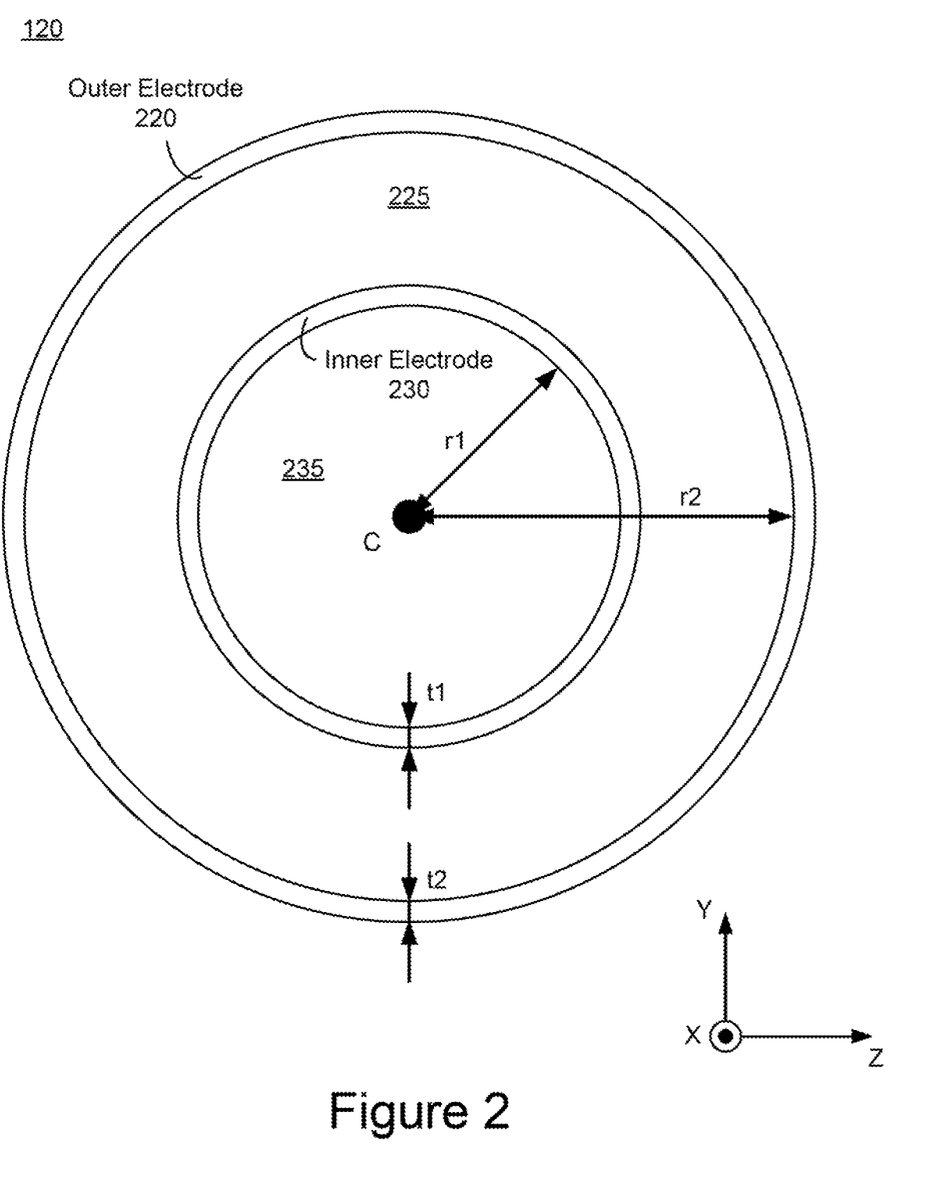
FIG. 2 is a cross-section view of a discoidal capacitor along a line A-A' of FIG. 1, in accordance with an illustrative embodiment.

Referring to FIG. 2, illustrated is a cross-section view of a discoidal capacitor 120 along a line A-A' of FIG. 1, in accordance with an illustrative embodiment. In some embodiments, the cross-section of the discoidal capacitor 120 includes an outer electrode 220, an inner electrode 230, a space between the electrodes 220, 230, and a space 235 enclosed by the inner electrode 230. In other embodiments, the cross-section of the discoidal capacitor 120 includes more, fewer, or different components than shown in FIG. 2.

In some embodiments, the cross-section of the outer electrode 220 circumscribes the cross-section of the inner electrodes 230. In particular, the cross-section of the inner electrode 230 with a thickness t1 may have a circular shape with a first radius r1 with respect to a center point C. The cross-section of the outer electrode 220 with a thickness t2 may have a circular shape with a second radius r2 with respect to the center point C, where the second radius r2 may be larger than the first radius r1. The space 225 between the inner electrode 230 and the outer electrode 220 may be filled with dielectric materials, multilayer ceramic, or air. In addition, the space 235 within the cross-section of the inner electrode 230 may be filled with dielectric materials, multilayer ceramic or air. In some embodiments, the space 225 between the electrode 220, 230 may include a plurality of interleaved electrode plates that are alternatively coupled to the respective external electrodes to form a multi-layer ceramic capacitor. In this configuration, a parasitic inductance of the discoidal capacitor may be reduced compared to other capacitors, for example, having two parallel planar electrodes.

Figure 3:
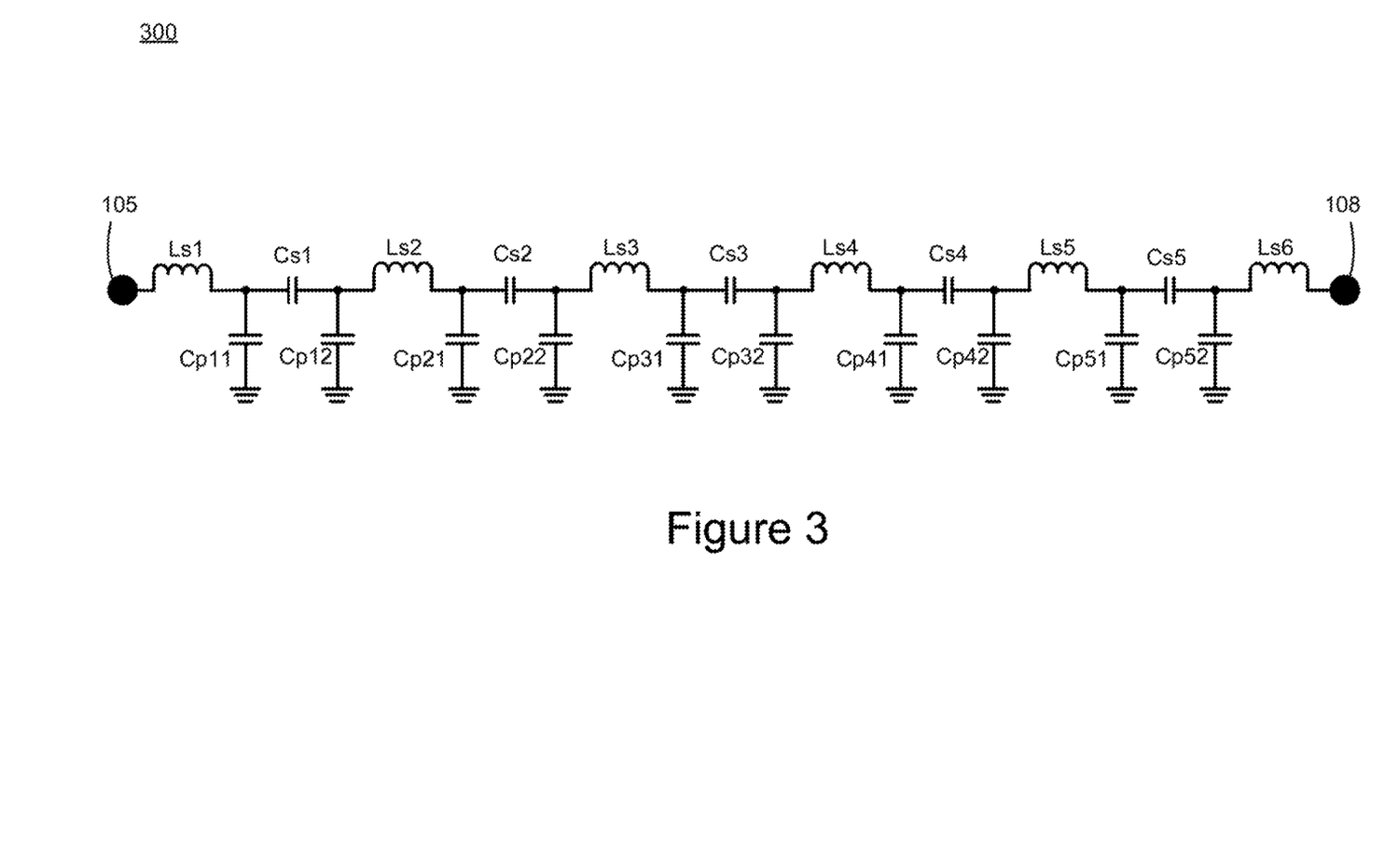
FIG. 3 is a schematic circuit diagram of the coaxial RF filter device of FIG. 1, in accordance with an illustrative embodiment.

FIG. 3 is a schematic circuit diagram 300 of the filter device 100 of FIG. 1, in accordance with an illustrative embodiment. The filter device 100 may be modeled as a series connection of inductors Ls1, Ls2 . . . Ls6, and capacitors Cs1, Cs2 . . . Cs5 in alternating sequence with shunt capacitors at each node. In one aspect, capacitors Cs1, Cs2 . . . Cs5 may correspond to the discoidal capacitors 120A, 120B . . . 120E, respectively, and inductors Ls1, Ls2 . . . Ls6 may correspond to the connector 115, the inductors 130A, 130B, 130C, 130D, and the connector 118, respectively. The shunt capacitors Cp11, Cp12, Cp21 . . . Cp52, may incorporate parasitic capacitances of inductors and capacitors at corresponding nodes. By implementing the series connection of inductors Ls1, Ls2 . . . Ls6, and the capacitors Cs1, Cs2 . . . Cs5 in alternating sequence as schematically represented in FIG. 2, the filter device 100 may operate as a bandpass filter with an in-band frequency, for example, between 1 GHz to 6 GHz.

Figure 4:
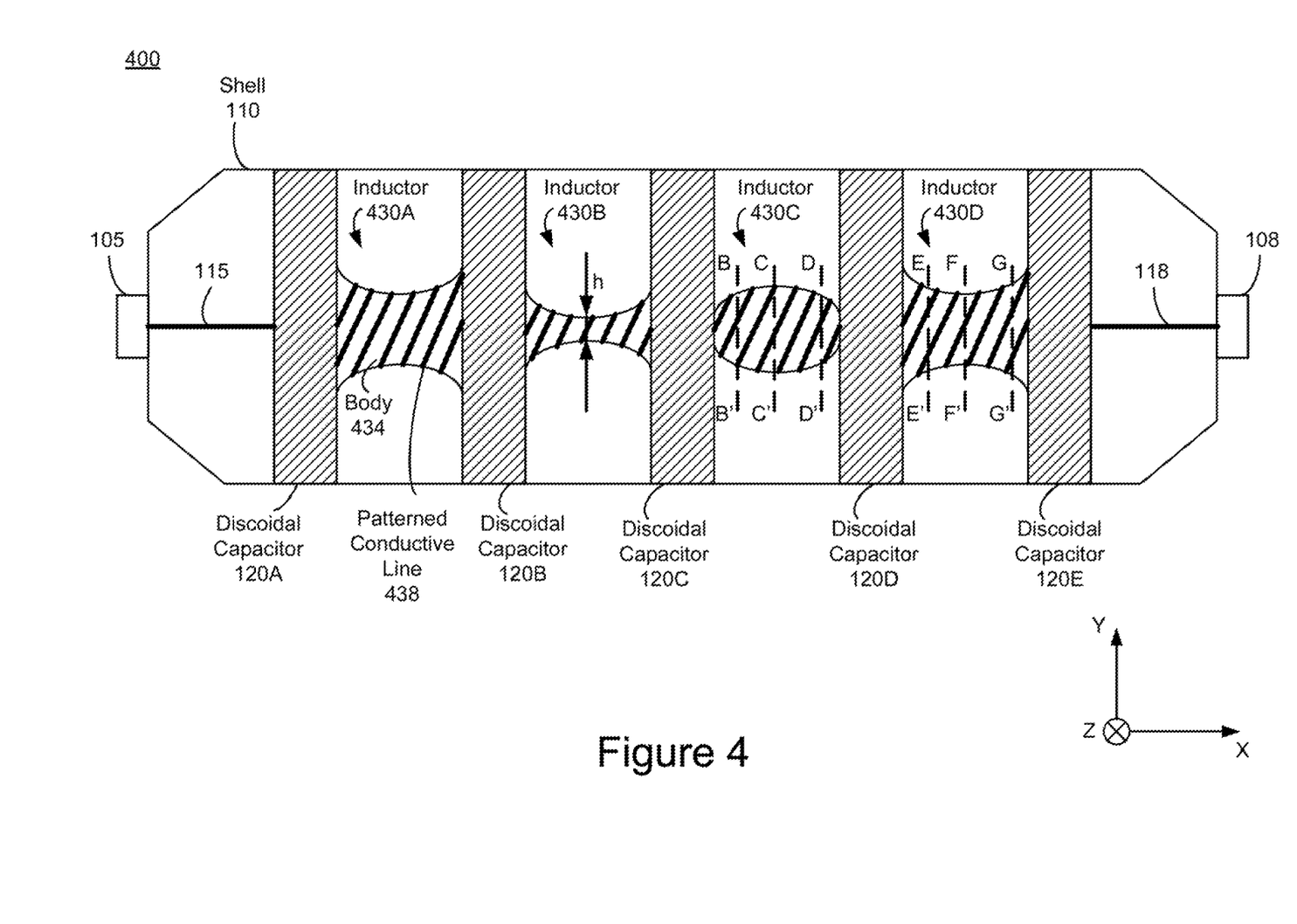
FIG. 4 is a plan view of a coaxial RF filter device with discoidal capacitors and patterned conductive lines, in accordance with another illustrative embodiment.

FIG. 4 is a plan view of a filter device 400 with discoidal capacitors and patterned conductive lines, in accordance with another illustrative embodiment. The filter device 400 of FIG. 4 is similar to the filter device 100 of FIG. 1, except that the inductors 130A, 130B, 130C, 130D of FIG. 1 are replaced with the inductors 430A, 430B, 430C, 430D having varying heights. Thus, detailed description of duplicative content thereof is omitted herein for the sake of brevity. In other embodiments, the filter device 400 includes more, fewer, or different components than shown in FIG. 4.

In some embodiments, each inductor 430 has a body 434 with a non-uniform profile along the x-direction, and a patterned conductive line wound on the body 434. Specifically, each body 434 has a varying height h along the X axis, where a height h of a body 434 is measured in the y-direction perpendicular to the x-direction. For example, a height h of the inductor 430 may decrease or increase along the x-direction. In one aspect, bodies of the inductors 430A, 430B, 430D have concave shapes, and a body of the inductor 430C has a convex shape. Varying height h of the body 434 allows a quality factor Q of the inductor 430. Implementing the inductors 430 with non-uniform profiles allows each inductor to be implemented with a smaller form factor (e.g., a smaller length along the x-direction), compared to inductors having a uniform profile or a solenoid shape as shown in FIG. 1.

Figure 5A:
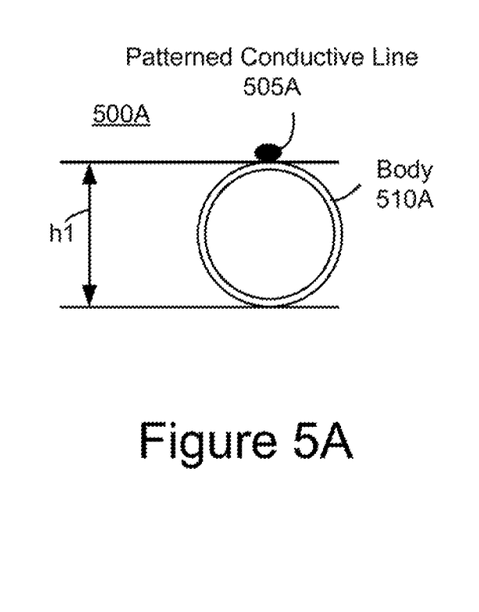
FIG. 5A is a cross-section view of a first inductor along a line B-B' of FIG. 4, in accordance with an illustrative embodiment.
Figure 5B:
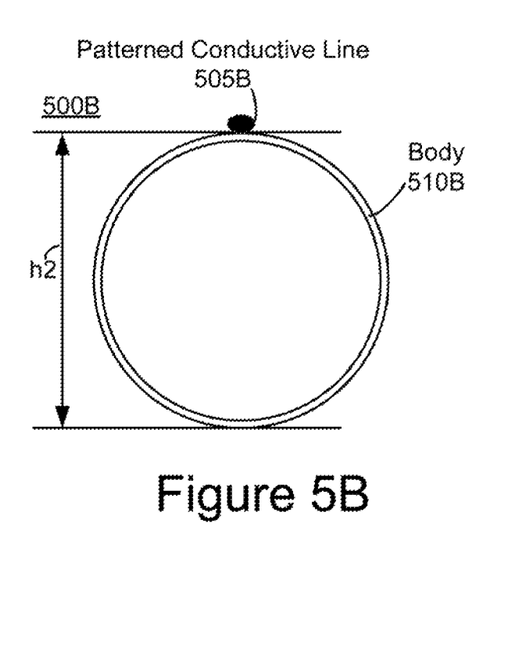
FIG. 5B is a cross-section view of the first inductor along a line C-C' of FIG. 4, in accordance with an illustrative embodiment.
Figure 5C:
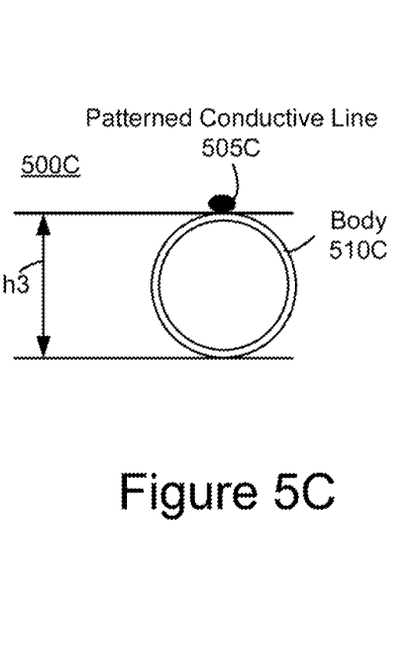
FIG. 5C is a cross-section view of the first inductor along a line D-D' of FIG. 4, in accordance with an illustrative embodiment.

FIGS. 5A through 5C show cross-sections 500A, 500B, 500C of the inductor 430C along lines B-B', C-C', D-D' of FIG. 4 to better illustrate varying heights of the inductor 430C.

In FIG. 5A, the cross-section 500A of the inductor 430C along the line B-B' of FIG. 4 is shown. In one implementation, a cross-section of the body 510A has a circular shape with a height h1 (or a diameter), where a patterned conductive line 505A is disposed on the body 510A. The body 510A may be the body 434 of the inductor 430C of FIG. 4, and the patterned conductive line 505A may be the patterned conductive line 438 of the inductor 430C of FIG. 4. A cross-section of the patterned conductive line 505A may have an oval shape. In other embodiments, the cross-section of the patterned conductive line 505A may have different shapes (e.g., planar shapes, circular shapes, curved shapes, polygonal shapes, or any combination them).

In FIG. 5B, the cross-section 500B of the inductor 430C along the line C-C' of FIG. 4 is shown. The cross-section 500B of the inductor 430C is similar to the cross-section 500A of the inductor 430C shown in FIG. 5A, except that a cross-section of the body 510B has a circular shape with a height h2 (or a diameter) larger than the height h1 of the cross-section of the body 510A.

In FIG. 5C, the cross-section 500C of the inductor 430C along the line D-D' of FIG. 4 is shown. The cross-section 500C of the inductor 430C is similar to the cross-section 500A of the inductor 430C shown in FIG. 5A, except that a cross-section of the body 510C has a circular shape with a height h3 (or a diameter) smaller than the height h2 of the cross-section of the body 510B. The height h3 may be same as or different from the height h1 of the cross-section of the body 510A.

In one aspect, the cross-section 500B of the inductor 430C is closer to the discoidal capacitor 120D than the cross-section 500A of the inductor 430C, and the cross-section 500C of the inductor 430C is closer to the discoidal capacitor 120D than the cross-section 500B of the inductor 430C. Hence, a height of the inductor 430C increases from an end of the discoidal capacitor 120C towards a point between the discoidal capacitors 120C, 120D along the x-direction, then decreases from the point towards an end of the discoidal capacitor 120D to form, for example, a convex shape.

Figure 6A:
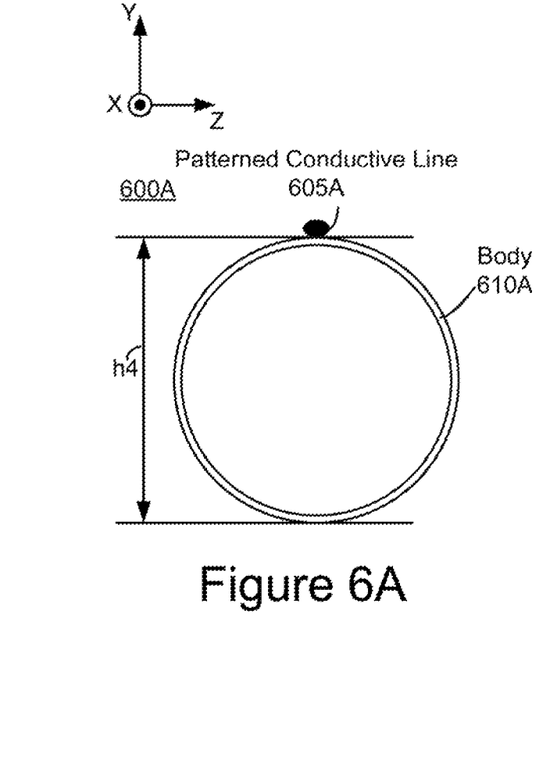
FIG. 6A is a cross-section view of a second inductor along a line E-E' of FIG. 4, in accordance with an illustrative embodiment.
Figure 6B:
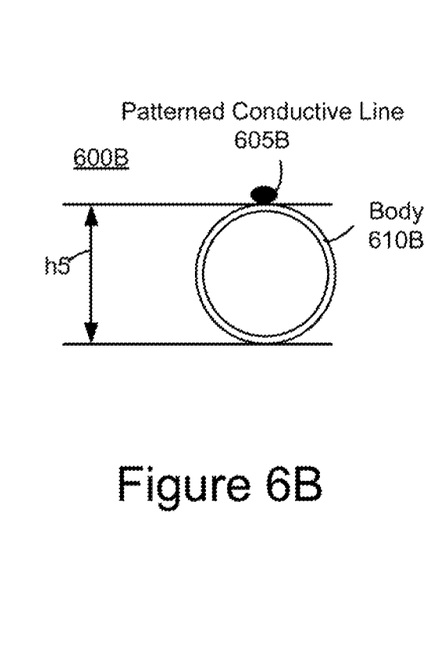
FIG. 6B is a cross-section view of the second inductor along a line F-F' of FIG. 4, in accordance with an illustrative embodiment.
Figure 6C:
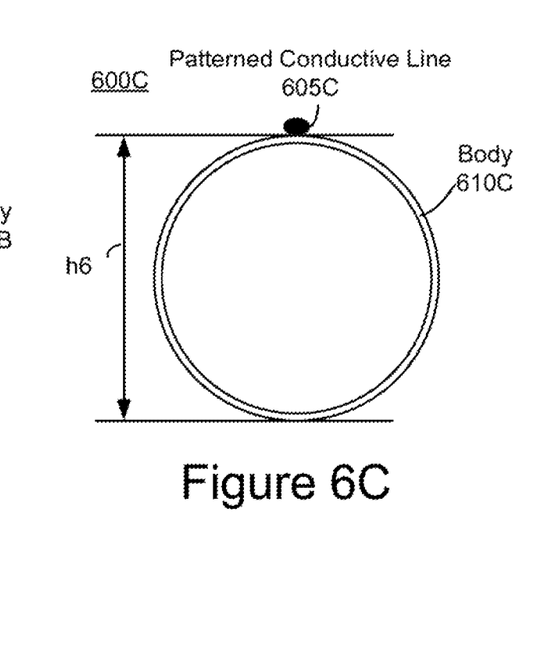
FIG. 6C is a cross-section view of the second inductor along a line G-G' of FIG. 4, in accordance with an illustrative embodiment.

FIGS. 6A through 6C show cross-sections 600A, 600B, 600C of the inductor 430D along lines E-E', F-F', G-G' of FIG. 4 to better illustrate varying heights of the inductor 430D.

In FIG. 6A, a cross-section 600A of the inductor 430D along a line E-E' of FIG. 4 is shown. In one implementation, a cross-section of the body 610A has a circular shape with a height h4 (or a diameter), where a patterned conductive line 605A is disposed on the body 610A. The body 610A may be the body 434 of the inductor 430D of FIG. 4, and the patterned conductive line 605A may be the patterned conductive line 438 of the inductor 430D of FIG. 4.

In FIG. 6B, a cross-section 600B of the inductor 430D along a line F-F' of FIG. 4 is shown. The cross-section 600B of the inductor 430D is similar to the cross-section 600A of the inductor 430D shown in FIG. 6A, except that a cross-section of the body 610B has a circular shape with a height h5 (or a diameter) smaller than the height h4 of the cross-section of the body 610A.

In FIG. 6C, a cross-section 600C of the inductor 430D along a line G-G' of FIG. 4 is shown. The cross-section 600C of the inductor 430D is similar to the cross-section 600A of the inductor 430D shown in FIG. 6A, except that a cross-section of the body 610C has a circular shape with a height h6 (or a diameter) larger than the height h5 of the cross-section of the body 610B. The height h6 may be same as or different from the height h4 of the cross-section of the body 610A.

In one configuration, the cross-section 600B of the inductor 430D is closer to the discoidal capacitor 120E than the cross-section 600A of the inductor 430D, and the cross-section 600C of the inductor 430D is closer to the discoidal capacitor 120E than the cross-section 600B of the inductor 430D. Hence, a height of the inductor 430D decreases from an end of the discoidal capacitor 120D towards a point between the discoidal capacitors 120D, 120E along the x-direction, then increases from the point towards an end of the discoidal capacitor 120E to form, for example, a concave shape.

Figure 7:
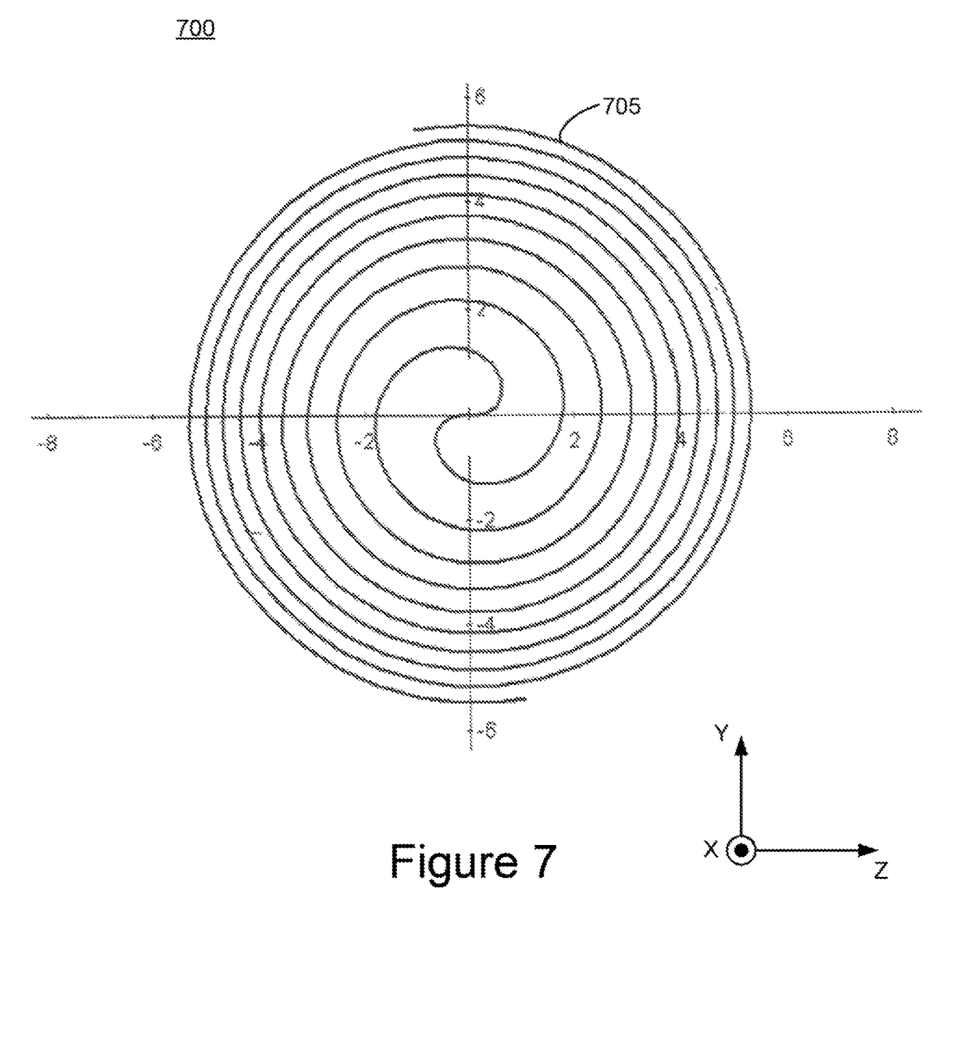
FIG. 7 is a plan view of a patterned conductive line of an inductor, in accordance with an illustrative embodiment.

FIG. 7 is a plan view of a patterned conductive line 700 of an inductor, in accordance with an illustrative embodiment. The patterned conductive line 700 has a Fermat's spiral shape. The patterned conductive line 700 may be the patterned conductive line 438 of the inductor 430D of FIG. 4. In one approach, the patterned conductive line 700 may be formed according to an equation below:

$$Z=\sqrt{X}(\cos(X|a|), Y=\sqrt{X}\sin(X|a|)) \qquad \text{Eq. (1)}$$

where Z is a coordinate according to the z-direction; Y is a coordinate according to the y-direction; X is a coordinate according to the x-direction; and a is a constant.

Figure 8:
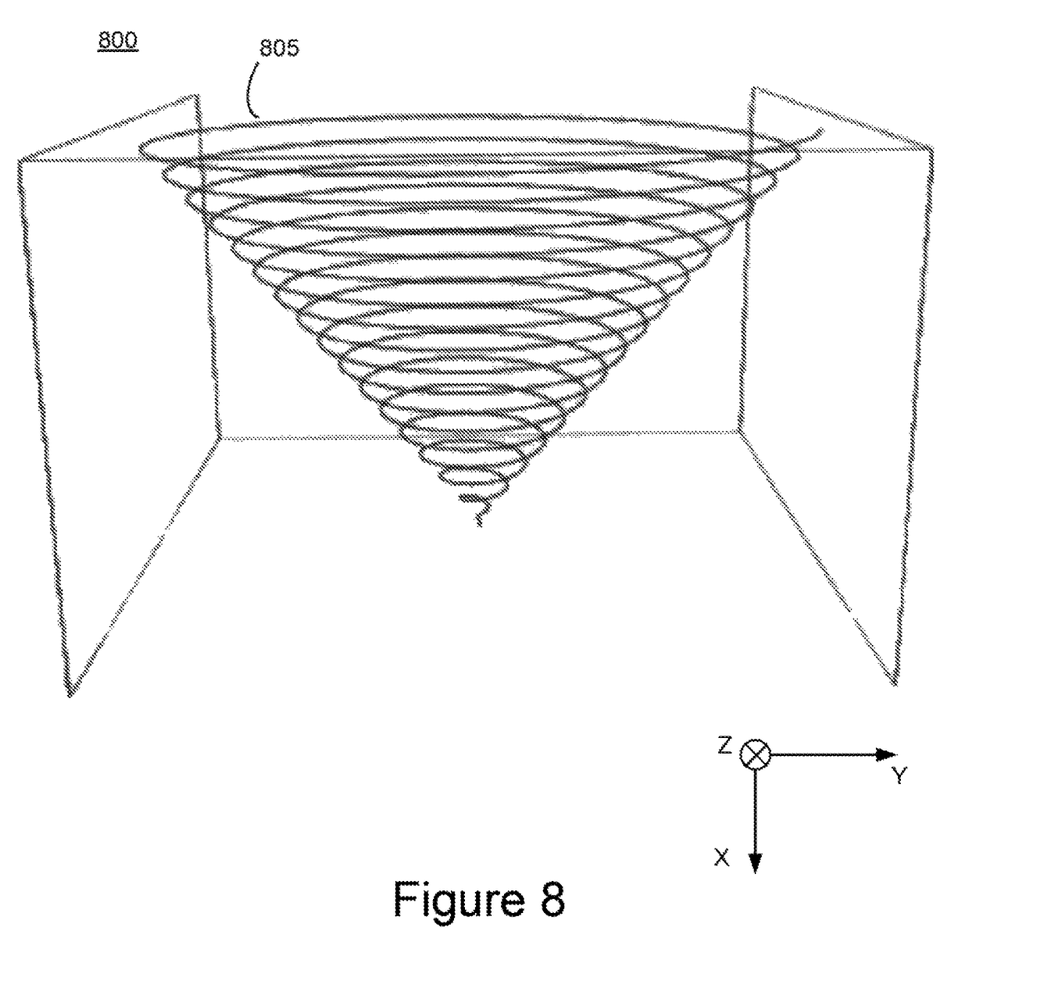
FIG. 8 is a perspective view of a patterned conductive line of an inductor, in accordance with another illustrative embodiment.

FIG. 8 is a perspective view of a patterned conductive line 800 of an inductor, in accordance with another illustrative embodiment. The patterned conductive line 800 has a conical helix shape. In one approach, the patterned conductive line 800 may be formed according to an equation below:

$$Y = \frac{h-X}{h}\cos(aX),\ Z = \frac{h-X}{h}\sin(aX) \qquad \text{Eq. (2)}$$

where X is a coordinate according to the x-direction; Y is a coordinate according to the y-direction; Z is a coordinate according to the z-direction; h is a maximum height of the inductor along the y-direction; and a is a constant.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality, and any two components capable of being so associated can also be viewed as being "operably couplable," to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B." Further, unless otherwise noted, the use of the words "approximate," "about," "around," "substantially," etc., mean plus or minus ten percent.

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

What is claimed is:

1. A filter device comprising:
   a shell elongated in a stack direction;
   a first discoidal capacitor within the shell;
   a second discoidal capacitor within the shell, the first discoidal capacitor stacked above the second discoidal capacitor along the stack direction;
   a body having a circular cross section perpendicular to the stack direction and an outer tubular surface, the outer tubular surface extending between the first discoidal capacitor and the second discoidal capacitor in the stack direction; and
   an inductor comprising a first patterned conductive line within the shell, the first patterned conductive line coupled between the first discoidal capacitor and the second discoidal capacitor, the first patterned conductive line being entirely disposed on the outer tubular surface of the body from the first discoidal capacitor to the second discoidal capacitor, the first patterned conductive line helically wound around the body on the outer tubular surface.

2. The filter device of claim 1, wherein the first discoidal capacitor comprises a first electrode having a first tubular shape along the stack direction and a second electrode having a second tubular shape along the stack direction, a cross-section of the second electrode surrounding a cross-section of the first electrode.

3. The filter device of claim 1, wherein the first discoidal capacitor and the second discoidal capacitor are multilayer ceramic capacitors.

4. The filter device of claim 1, wherein the body comprises at least one of a liquid crystal polymer, Aluminum Nitride, and ceramic.

5. The filter device of claim 1, wherein the body has a circular cross-section perpendicular to the stack direction.

6. The filter device of claim 1, wherein the body has an increasing height along the stack direction, the height being measured in a perpendicular direction to the stack direction.

7. The filter device of claim 1, wherein the body has a decreasing height along the stack direction, the height being measured in a perpendicular direction to the stack direction.

8. The filter device of claim 1, wherein the body has a first cross-section perpendicular to the stack direction, a second cross-section perpendicular to the stack direction, and a third cross-section perpendicular to the stack direction, the first cross-section closer to the first discoidal capacitor than the second cross-section, the third cross-section closer to the second discoidal capacitor than the second cross-section.

9. The filter device of claim 8, wherein a first height of the first cross-section perpendicular to the stack direction is larger than a second height of the second cross-section perpendicular to the stack direction, and a third height of the third cross-section perpendicular to the stack direction is larger than the second height.

10. The filter device of claim 8, wherein a first height of the first cross-section perpendicular to the stack direction is less than a second height of the second cross-section perpendicular to the stack direction, and a third height of the third cross-section perpendicular to the stack direction is less than the second height.

11. The filter device of claim 1, further comprising:
a third discoidal capacitor within the shell; and
a second inductor comprising a second patterned conductive line within the shell, the second patterned conductive line coupled between the second discoidal capacitor and the third discoidal capacitor.

12. The filter device of claim 1, wherein the shell comprises micro-polished copper.

13. The filter device of claim 1, wherein the body is in direct physical contact with each of the first discoidal capacitor and the second discoidal capacitor.

14. A filter device comprising:
a shell elongated in a stack direction;
an electrical signal input port;
an electrical signal output port;
a first discoidal capacitor within the shell coupled between the electrical signal input port and the electrical signal output port;
a second discoidal capacitor within the shell coupled between the first discoidal capacitor and the electrical signal output port; and
a patterned conductive line formed on a body and within the shell, the patterned conductive line coupled between the first discoidal capacitor and the second discoidal capacitor, the patterned conductive line being wound in a winding direction traversing the stack direction, wherein the body has at least one of an increasing height or a decreasing height along the stack direction measured in a perpendicular direction to the stack direction;
wherein the body has a first cross-section perpendicular to the stack direction, a second cross-section perpendicular to the stack direction, and a third cross-section perpendicular to the stack direction, the first cross-section closer to the first discoidal capacitor than the second cross-section, the third cross-section closer to the second discoidal capacitor than the second cross-section, wherein a first height of the first cross-section perpendicular to the stack direction is larger than a second height of the second cross-section perpendicular to the stack direction, and a third height of the third cross-section perpendicular to the stack direction is larger than the second height.

15. The filter device of claim 14, wherein the body has a tubular shape along the stack direction.

16. The filter device of claim 14, wherein the first discoidal capacitor comprises a first electrode having a first tubular shape along the stack direction and a second electrode having a second tubular shape along the stack direction, a cross-section of the second electrode surrounding a cross-section of the first electrode.

17. The filter device of claim 14, wherein a first height of the first cross-section perpendicular to the stack direction is less than a second height of the second cross-section perpendicular to the stack direction, and a third height of the third cross-section perpendicular to the stack direction is less than the second height.

18. A filter device comprising:
a shell elongated in a stack direction;
a first discoidal capacitor within the shell;
a second discoidal capacitor within the shell, the first discoidal capacitor stacked above the second discoidal capacitor along the stack direction;
a body extending between the first discoidal capacitor and the second discoidal capacitor in the stack direction, the body directly contacting each of the first discoidal capacitor and the second discoidal capacitor; and
an inductor comprising a first patterned conductive line within the shell, the first patterned conductive line coupled between the first discoidal capacitor and the second discoidal capacitor, the first patterned conductive line being wound around the body on the outer tubular surface of the body about the stack direction.

\* \* \* \* \*